US012569792B1

(12) United States Patent (10) Patent No.: US 12,569,792 B1
Niemi (45) Date of Patent: Mar. 10, 2026

(54) COMPUTER FARM VENTILATION SYSTEM

(71) Applicant: S-M Enterprises, Inc., Moorhead, MN (US)

(72) Inventor: Dale W. Niemi, Moorhead, MN (US)

(73) Assignee: S-M Enterprises, Inc., Moorhead, MN (US)

( * ) Notice: Subject to any disclaimer, the term of this patent is extended or adjusted under 35 U.S.C. 154(b) by 449 days.

(21) Appl. No.: 18/146,666

(22) Filed: Dec. 27, 2022

(51) Int. Cl.
*B01D 46/00* (2022.01)
*B01D 46/58* (2022.01)
*H05K 7/20* (2006.01)

(52) U.S. Cl.
CPC ......... *B01D 46/0002* (2013.01); *B01D 46/58* (2022.01); *H05K 7/20718* (2013.01); *B01D 2267/30* (2013.01); *B01D 2275/203* (2013.01)

(58) Field of Classification Search
CPC ...................... B01D 46/0002; B01D 46/0005; B01D 46/58; B01D 2267/30; B01D 2279/45; B01D 2275/203; H05K 7/20718
See application file for complete search history.

(56) References Cited

U.S. PATENT DOCUMENTS 5,797,975 A * 8/1998 Davis ...................... B01D 46/12
                                                        55/491
9,668,375 B2 5/2017 Totani

| 2011/0009047 | A1 | 1/2011 | Noteboom |
| 2011/0105015 | A1 | 5/2011 | Carlson |
| 2014/0259966 | A1 | 9/2014 | Totani |
| 2024/0198266 | A1 * | 6/2024 | Jablonski ........... B01D 46/0005 |

OTHER PUBLICATIONS https://journal.uptimeinstitute.com/data-center-free-air-cooling-trends/ #:~: text=Direct%20air%3A%20Outside%20air%20passes,inlet% 20temperature%20for%20the%20facility; UptimeInstitute Webpage Article "Data Center Free Air Cooling Trends"; Rabih Bashroush; Sep. 9, 2019.
https://www.datacenterknowledge.com/inside-microsofts-dublin-mega-data-center/dublin-data-center-free-cooling-diagram; DataCenter Knowledge Article "Dublin Data Center: Free Cooling Diagram"; Sep. 28, 2009.
https://www.acr-news.com/stulz-dfc---direct-free-cooling-for-data-centres-; ACR News; Stulz DFC2 Direct Free Cooling for Data Centres; Jan. 31, 2011.
https://www.systemair.com/ie/applications/data-centre/indirect-free-cooling-units-for-data-centres/; Systemair "Indirect Free Cooling Units for Data Centres" Webpage; Printed Nov. 18, 2022.
https://www.akcp.com/articles/best-data-center-cooling-practices-to-implement/; AKCP "Best Data Center Cooling Practices to Implement"; Clarissa Garcia; Jun. 2021.

* cited by examiner

*Primary Examiner* — Robert Clemente
(74) *Attorney, Agent, or Firm* — Neustel Law Offices

(57) ABSTRACT

A system for filtering an airflow of exterior ambient air. The system includes a plurality of frame uprights, a plurality of crossbars pivotally connected to the frame uprights and a plurality of filters that are slidably received between the plurality of crossbars.

10 Claims, 10 Drawing Sheets

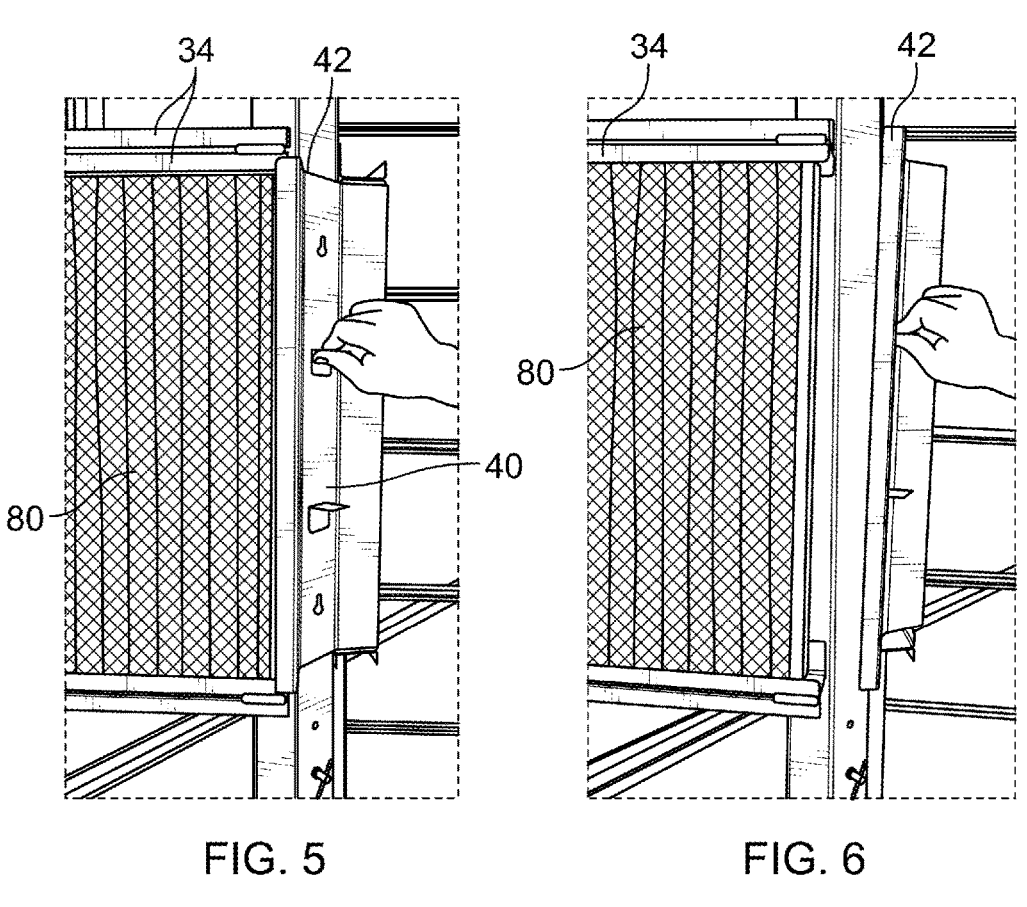
FIG. 5                 FIG. 6
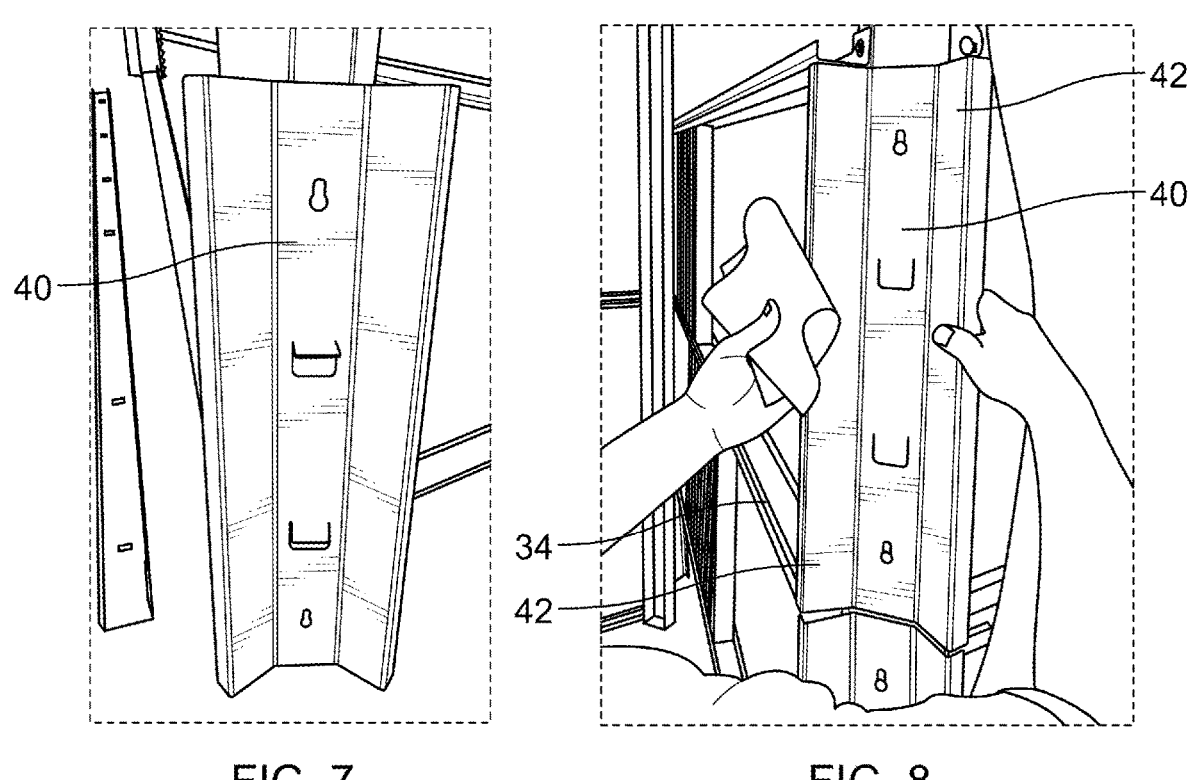
FIG. 7                 FIG. 8

COMPUTER FARM VENTILATION SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND

The described example embodiments in general relate to filter structures for cleaning air.

The growth of Web-based and Internet services has created an industry reliant on datacenters, server farms, and other computer rooms that generate significant amounts of heat that must be removed from around the computer equipment. Datacenter cooling solutions often include either indirect air or direct air-cooling system solutions. US20110009047A1 discloses a system that combines direct air and indirect air solutions. A control system selectively directs an air handler and cooling fans to circulate either direct or indirect air over rack mounted computer equipment. US20110105015A1 discloses use of a plenum and chimney to use heat from the computer equipment to lower air pressure and force air flow across the equipment. Stack structure that interfaces with an environment and one or more housings coupled to a floor and the stack structure. U.S. Pat. No. 9,668,375B2 discloses a building or datacenter with a stack structure of servers that interfaces with the environment and includes one or more racks with a plurality of servers and each of the servers includes a computer fan capable of varying speed or reversing direction.

In indirect air-cooling systems, the datacenter equipment is not exposed to outside air and instead a heat exchanger may circulate heated inside air while using the outside air to cool the inside air in the heat exchanger. In direct air-cooling systems, outside air, which is cooler than inside air, is forced across the datacenter equipment to directly exchange the heated datacenter air with cooler air from outside. Several proposed art solutions disclose indirect or direct air-cooling solutions or combinations thereof. Closed system forced air systems tend to be cleaner in general since outside air is isolated from the datacenter equipment but are more expensive to operate than direct air-cooling systems. On the other hand, direct air-cooling solutions may expose expensive and sensitive computer equipment to particulate matter in the forced air that may damage the equipment. Accordingly, there is a need for air filtration in direct air-cooling solutions.

SUMMARY

Some of the various embodiments of the present disclosure relate to a scalable computer farm ventilation system that is positionable in the path of an airflow source to reduce unwanted particulate in the airflow. The system may be used to reduce unwanted particulate in an airflow source whether the airflow source is intended for human respiration or used to ventilate cooling air for sensitive scientific or electronic equipment, datacenters, server farms, or warehouses. Various embodiments of the presently disclosed system comprise a filter frame that includes a plurality of frame uprights and filter crossbars, each filter crossbar with first and second distal ends pivotally coupled between a first and second frame uprights that are respectively spaced apart and adapted to receive at least one filter between vertically adjacent filter crossbars. System embodiments constructed according to the disclosure may employ any of various size and rating commercially available air filters that are received or installed between vertically adjacent filter crossbars and retrieved or removed from between said crossbars when the air filters become clogged and subsequently, replaced with fresh or new air filters.

The embodiments enable a filter frame system that may be positioned substantially orthogonally to the path of a forced or natural airflow source to reduce particulate matter suspended in the airflow. Aspects of the disclosed embodiment enable a system suited for situations where the filter frame system must be positioned over an area with an uneven floor. In such situations, one or several of the frame uprights of the filter frame may be displaced vertically relative to a second or several other of the frame uprights to ensure that each upright maintains contact with the uneven floor surface and thereby the stability of the filter frame system despite the uneven floor.

A further aspect of the present system comprises a staggered or zig-zag distribution of the frame uprights with a plurality of the uprights comprising a front row of frame uprights relative to the direction of oncoming airflow, and a second plurality of the uprights comprising a back or rear row of frame uprights. The distributed front and back rows of uprights stabilize filter frame constructions placed in the path and force of impinging airflow, facilitate installation and changing of filters in filter frame embodiments, including the attachment of prefilter fabric or material to and between adjacent the front row of frame uprights. The system thus also enables a method of filtering particulate matter from an airflow source by installing filters in a filter frame that comprises a plurality of frame uprights and filter crossbars that are pivotally coupled at distal ends to and between two frame uprights that are arranged in a front row and back row and positioning the filter frame in the path of airflow. A further aspect of the method includes displacing at least one of the frame uprights relative to another frame upright, which may be employed in the occurrence of an uneven floor or surface on which the filter frame is positioned. Yet another aspect of the filter frame system is the inclusion of a removably attachable filter stop plate that facilitates the installation and change of filters into channels that extend along and between the filter crossbars and that are adapted to slidably receive filters. Still another aspect of the system is a combination filter stop plate and prefilter claim that both facilitates the installation and change of filters into channels and also enables the clamping of prefilter fabric or material onto the front row of uprights of the filter system.

There has thus been outlined, rather broadly, some of the embodiments of the present disclosure in order that the detailed description thereof may be better understood, and in order that the present contribution to the art may be better appreciated. There are additional embodiments that will be described hereinafter and that will form the subject matter of the claims appended hereto. In this respect, before explaining at least one embodiment in detail, it is to be understood that the various embodiments are not limited in its application to the details of construction or to the arrangements of the components set forth in the following description or illustrated in the drawings. Also, it is to be understood that the phraseology and terminology employed herein are for the purpose of the description and should not be regarded as limiting.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evidence to the contrary from the description, where elements in different figures use identical reference numbers, the elements are generally either identical or at least similar in function or purpose.

BRIEF DESCRIPTION OF THE DRAWINGS

FIGS. 5 and 6 are side perspective views of the filter stop plate 40 and upper and lower channels 34 between the first and second distal ends 32 on each filter stop plate 40, and illustrates the removal or detachment of the filter stop plate 40 from the frame upright 20 to access a filter 80 installed between vertically adjacent filter crossbars 30.

FIGS. 7 and 8 are rear perspective views of the filter stop plate 40 and the filter stop-plate lateral surface 42 and a keyhole and bolt adapted to facilitate removable attachment of the filter stop plates 40 to frame uprights 20.

Figure 13:
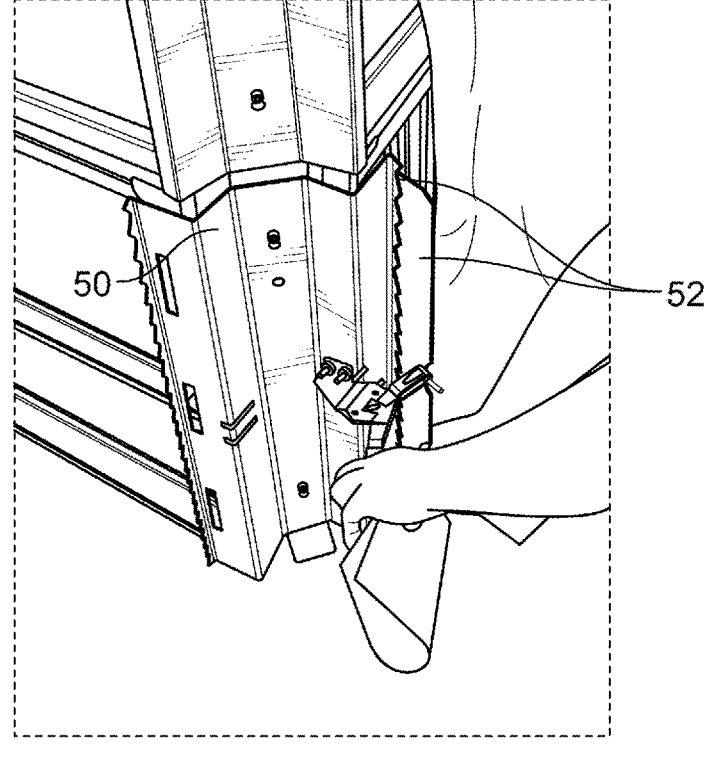

FIG. 13 is a rear perspective view that illustrates operation of the combination filter stop plate and prefilter clamp 50 to clamp prefilter 82 fabric or material.

Figure 14:
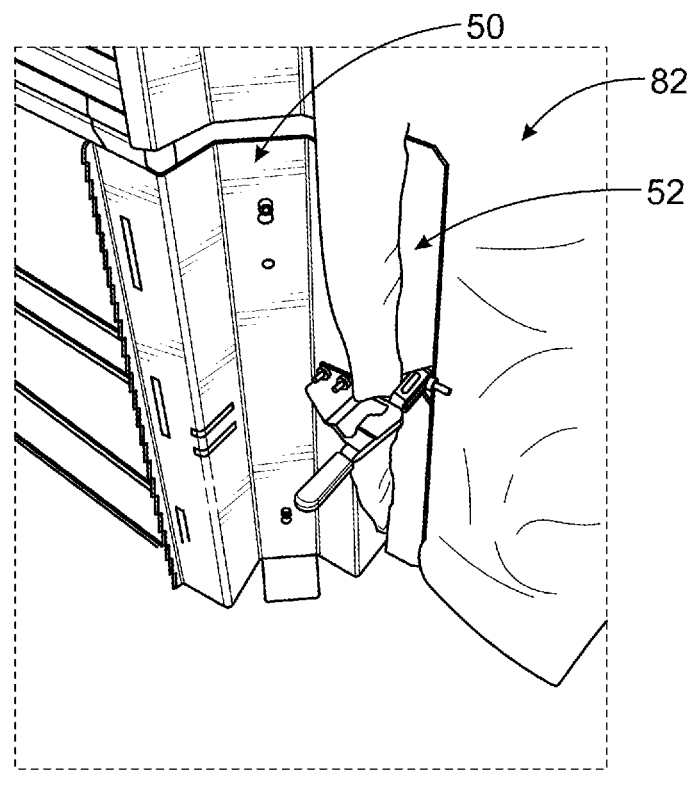
Figure 15:
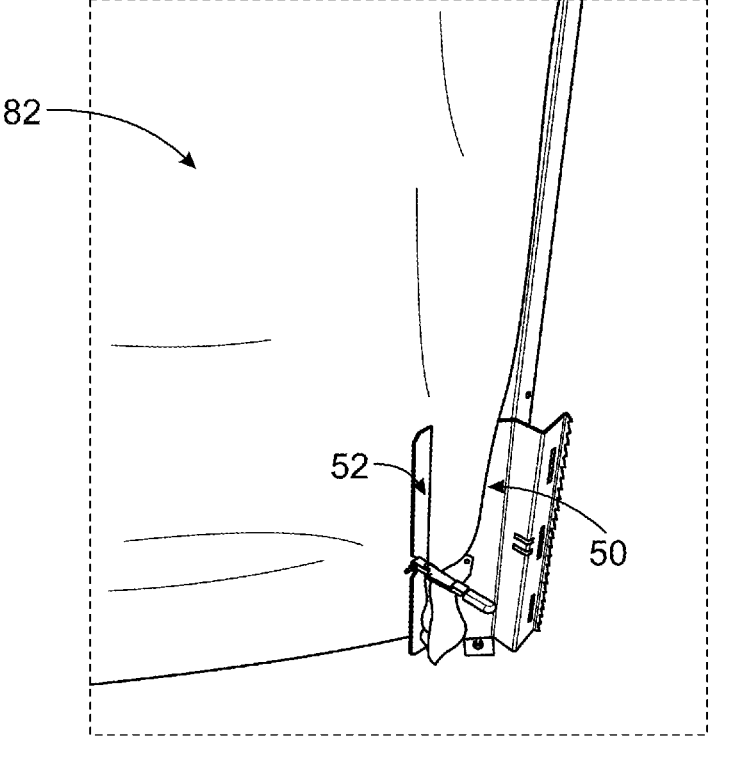

FIGS. 14 and 15 illustrate additional views of operation of the combination filter stop plate and prefilter clamp 50.

Figure 16:
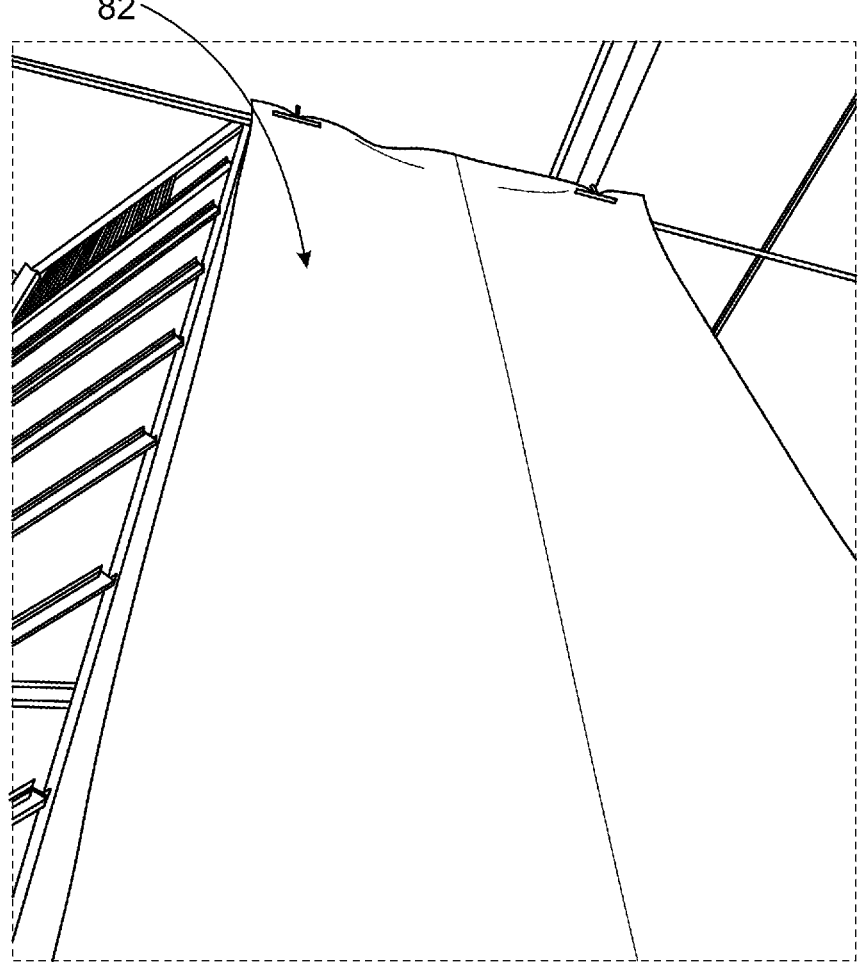

FIG. 16 illustrates a front perspective view of the embodiment with prefilter 82 fabric or material clamped to the filter frame 10.

DETAILED DESCRIPTION

Various embodiments of the present disclosure relate to a filter frame 10 system that is positioned in an airflow to reduce the particulate matter in the airflow. Embodiments of filter frames 10 are adapted to filter a forced airflow that is used to ventilate or cool instrumentation, machinery, or computer equipment in a datacenter. Various embodiments of the present system include frame uprights 20 and filter crossbars 30, which are pivotally 15 attached thereto and thereby enable vertical displacement 36 of individual frame uprights 20 relative to other frame uprights 20 to accommodate an uneven or sloped floor on which the filter is positioned. Preferred embodiments of filter frames 10 employ the use of commercially available and standard sized air filters 80 that are slidably received from between vertically adjacent filter crossbars 30.

In some embodiments, a filter stop plate 40 may be used to facilitate installation and removal of filters 80 between vertically adjacent filter crossbars 30 and in other embodiments, a combination filter stop plate and prefilter clamp 50 may be used to secure air of prefilter 82 material to the filter frame 10 to further improve the filter performance and potentially reduce the number of times that filters 80 must be changed. It is preferred that the frame uprights 20 and filter crossbars 30 be constructed from any material sufficient to withstand the forces anticipated by the described uses, but a preferred construction material comprises rigid segments comprised of iron or other metal adapted to withstand the forces inherent from the uses described herein.

Figure 1:
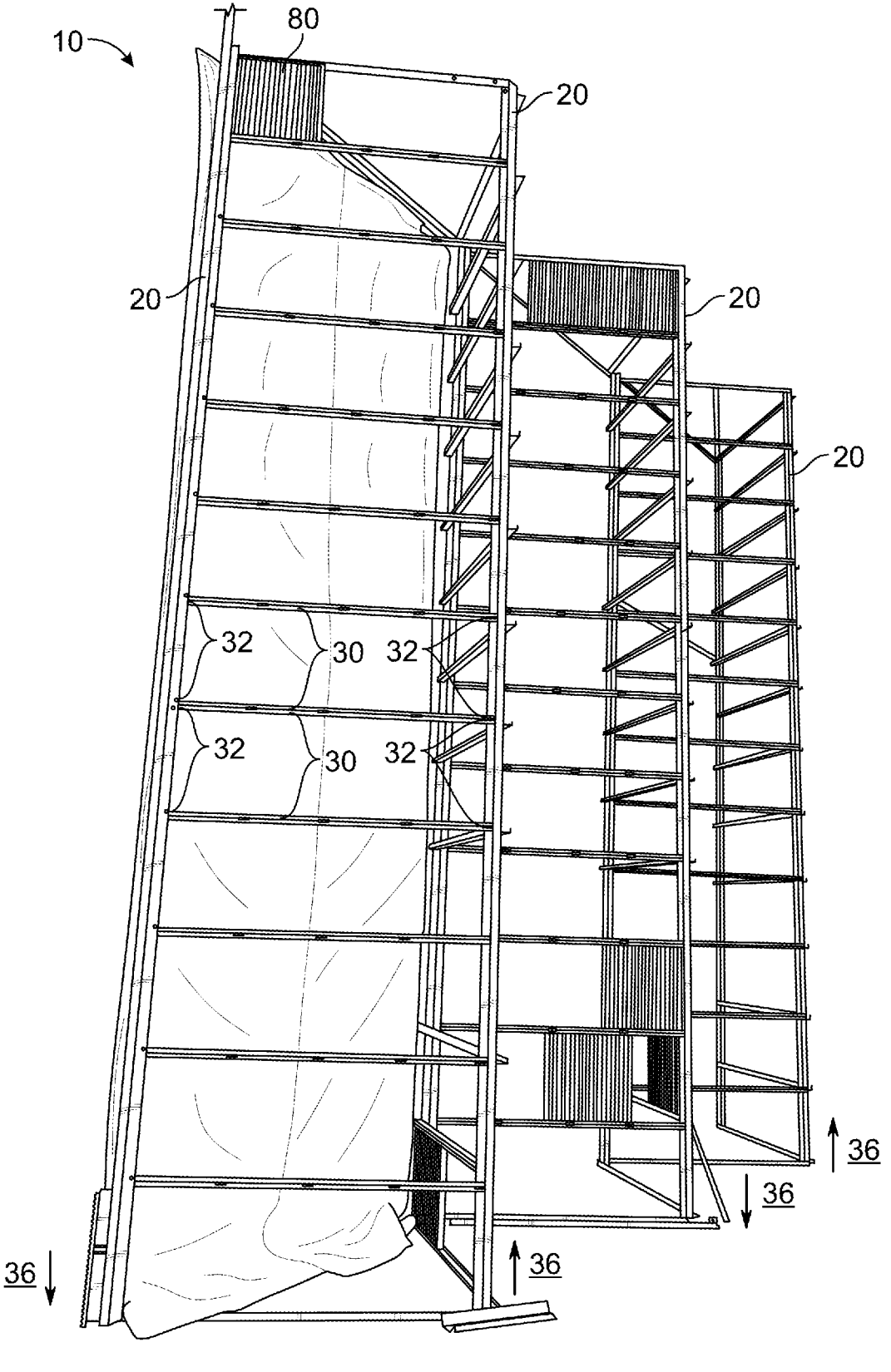
FIG. 1 is a perspective view of a filter frame 10 system embodiment constructed in accordance with the disclosure. The filter frame 10 embodiment includes frame uprights 20 and filter crossbars 30 wherein the filter crossbars 30 are pivotally coupled 15 to the frame uprights 20 at each distal end 32 and said pivotal unions enable vertical displacement 36 of one or more frame uprights 20 relative to a second or other frame upright 20. Adjacent filter crossbars 30 are vertically spaced apart and adapted to receive one or more filters 80.

With specific reference to FIG. 1, the filter frame 10, comprises at least a first frame upright 20 and a second frame upright 20, and at least first and second filter crossbars 30 with first distal ends 32 and second distal ends 32 that each are pivotally coupled 15 to the frame uprights 20 to enable vertical displacement 36 of individual frame uprights 20 relative to other frame uprights 20. The pivotal coupled 15 union of the uprights 20 and crossbars 30 facilitates filter frame 10 stability in situations where the floor on which the filter frame 10 is positioned is uneven or slopes in any direction underneath the filter frame 10. Individual uprights 20 may be displaced up or down in order that the uprights 20 maintain contact with the floor. Moreover, as illustrated, the filter frame 10 may include a third frame upright 20, and third and fourth filter crossbars 30, wherein the fourth filter crossbar is 30 substantially parallel to the third filter crossbar 30, and the third and fourth filter crossbars 30 have first distal ends 32, second distal ends 32, and a channel 34 at least partly along and between the first and second distal ends 32, with the first distal ends 32 pivotally coupled substantially orthogonally to the second frame upright 20, the second distal ends 32 pivotally coupled substantially orthogonally to the third frame upright 20.

The filter frame 10 system is scalable for all dimensions to accommodate various applications. Thus, the filter frame 10 system may comprise a plurality of frame uprights 20 and a plurality of filter crossbars 30, with each of the filter crossbars 30 pivotally coupled at distal ends thereof and substantially orthogonally to and between two of the plurality of frame uprights 20, each filter crossbar 30 with a channel 34 that may extend at least part of the length of the filter crossbar 30 on which it is positioned, and wherein the channels 34 on vertically adjacent filter crossbars 30 are distanced apart to slidably receive filters 80.

Figure 2:
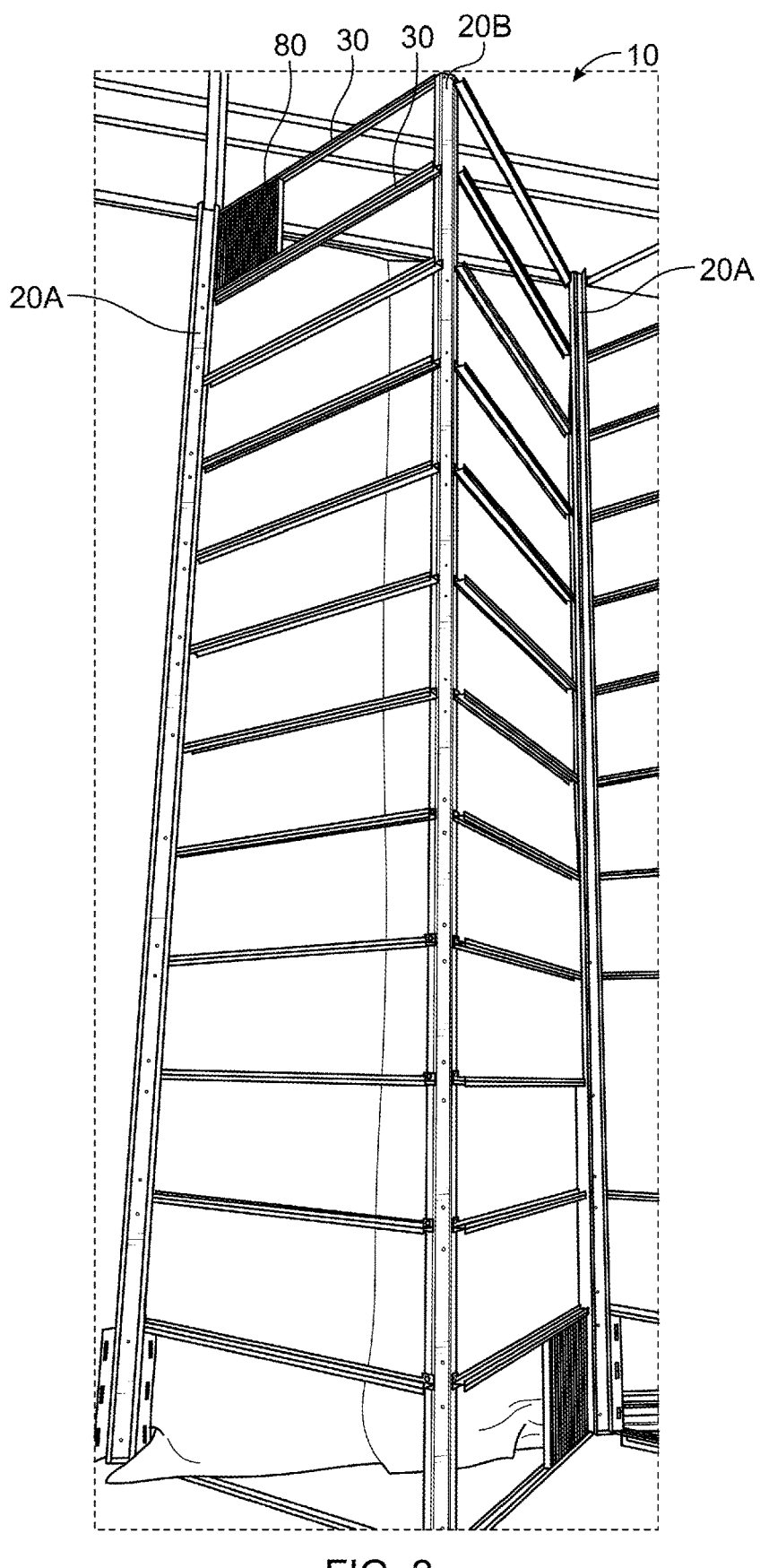
FIG. 2 is a rear perspective view of the filter frame 10 embodiment illustrating that filter crossbars 30 are vertically spaced apart and adapted to receive one or more filters 80. A prefilter 82 is removably attachable to a subset of a plurality of frame uprights 20A and form a front row of frame uprights 20A relative to the direction of airflow.
Figure 3:
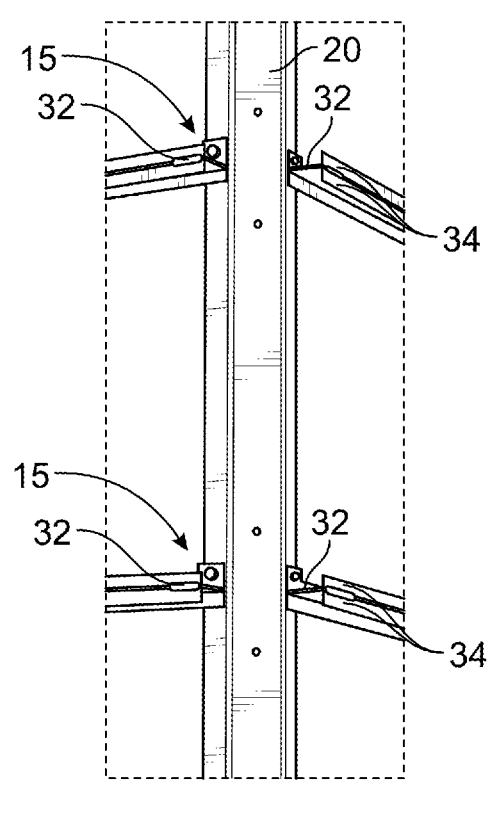
FIG. 3 is a rear perspective view of the filter frame 10 and details the pivotally coupled 15 frame uprights 20 and filter crossbars 30.

With reference to the FIG. 2, successive frame uprights 20 are distributed laterally in at least two dimensions and thus may be substantially arranged in a distributed or zig-zag pattern such that subset of the plurality of frame uprights 20A comprise a filter frame front boundary and a second subset of the plurality of frame uprights 20B may comprise a rear or back boundary of the frame 10. The distribution of frame uprights 20 as illustrated and described creates a structure that funnels airflow directed at the front row of frame uprights 20A into an acute angle comprised of filter crossbars 30 that extend from uprights in the back or rear row of frame uprights 20B. In preferred embodiments, and relative to the second upright 20, the first and second filter crossbars 30 and third and fourth filter crossbars 30 extend from the back or rear row frame uprights 20 at an angle of between about 30 and 120 degrees, but preferably about ninety degrees. FIG. 3 illustrates a rear and close up view of an example by which the filter crossbars 30 and frame uprights 20 are pivotally coupled 15. A bolt or other equivalently functioning hardware may be used to pivotally couple 15 the crossbars 30 and uprights 20. Moreover, the filter crossbars 30 may include upper and lower channels 34 that extend along and between the first and second distal ends 32 of the crossbars 30.

Figure 4:
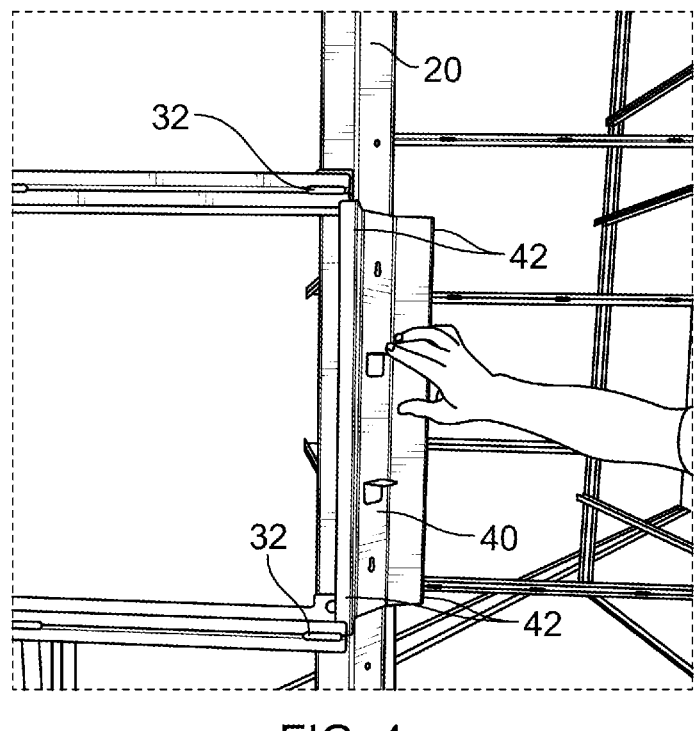
FIG. 4 is a side perspective view of the distal ends 32 of filter crossbars 30 and a removably attachable filter stop plate 40 embodiment, wherein the filter stop-plate lateral surface 42 is positioned adjacent to the crossbar distal ends 32 when the filter stop plate 40 is attached to the frame upright 20.
Figure 9:
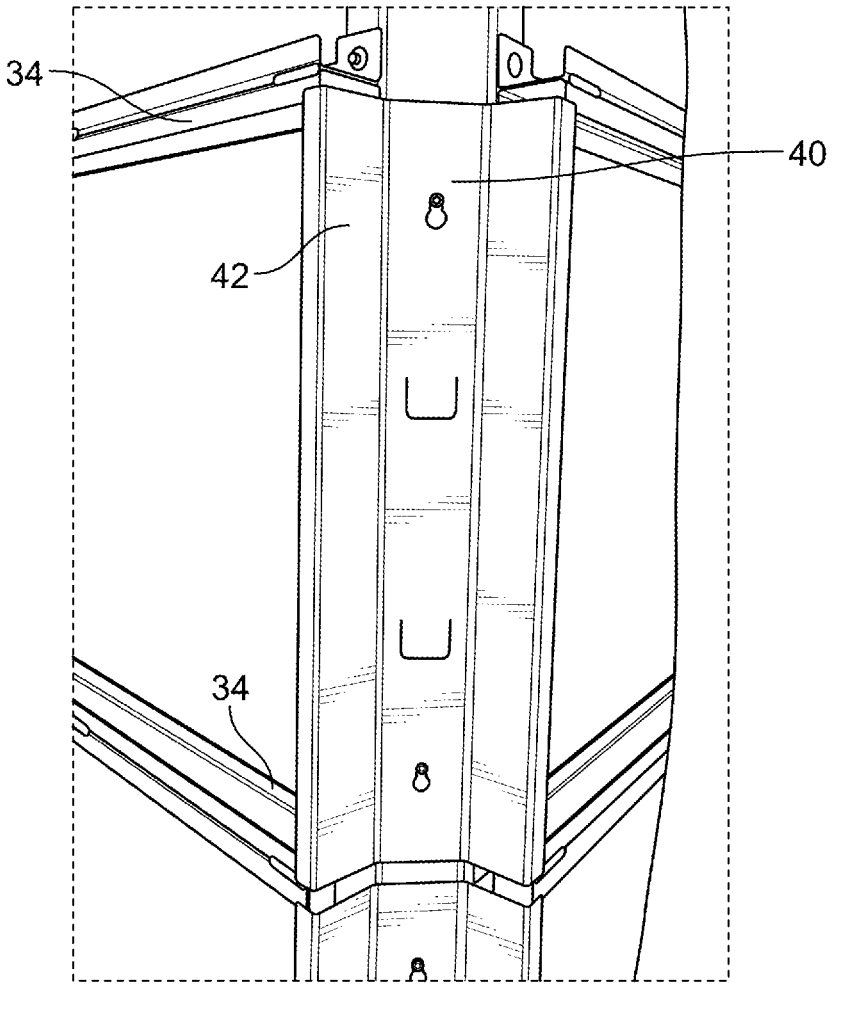
FIG. 9 is a rear view of the removably attachable filter stop plate 40 and its size and placement relative to the filter crossbar distal ends 32 and upper and lower channels 34 thereon.
Figure 10:
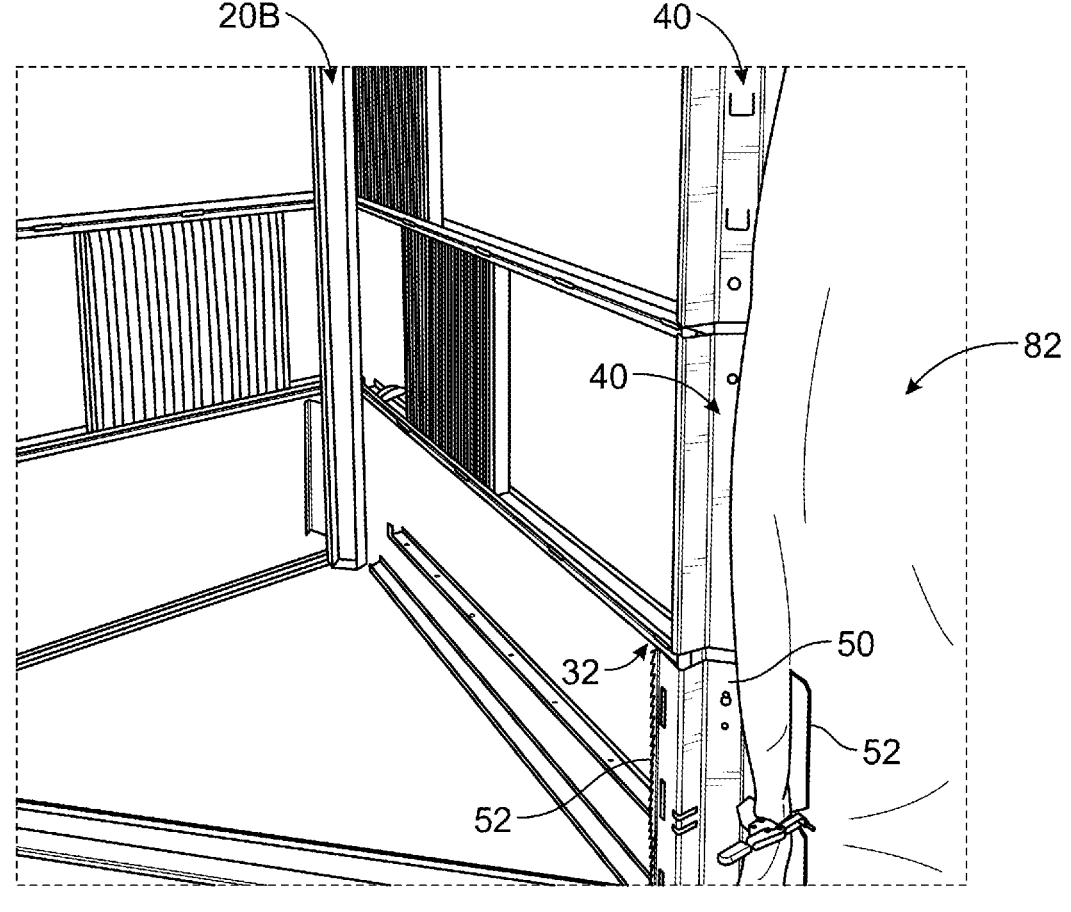
FIG. 10 is a front perspective view of a combination filter stop plate and prefilter clamp 50 embodiment that includes a clamp edge 52 adapted to clamp a prefilter 82 fabric or material that is stretched between two or more frame uprights 20.
Figure 11:
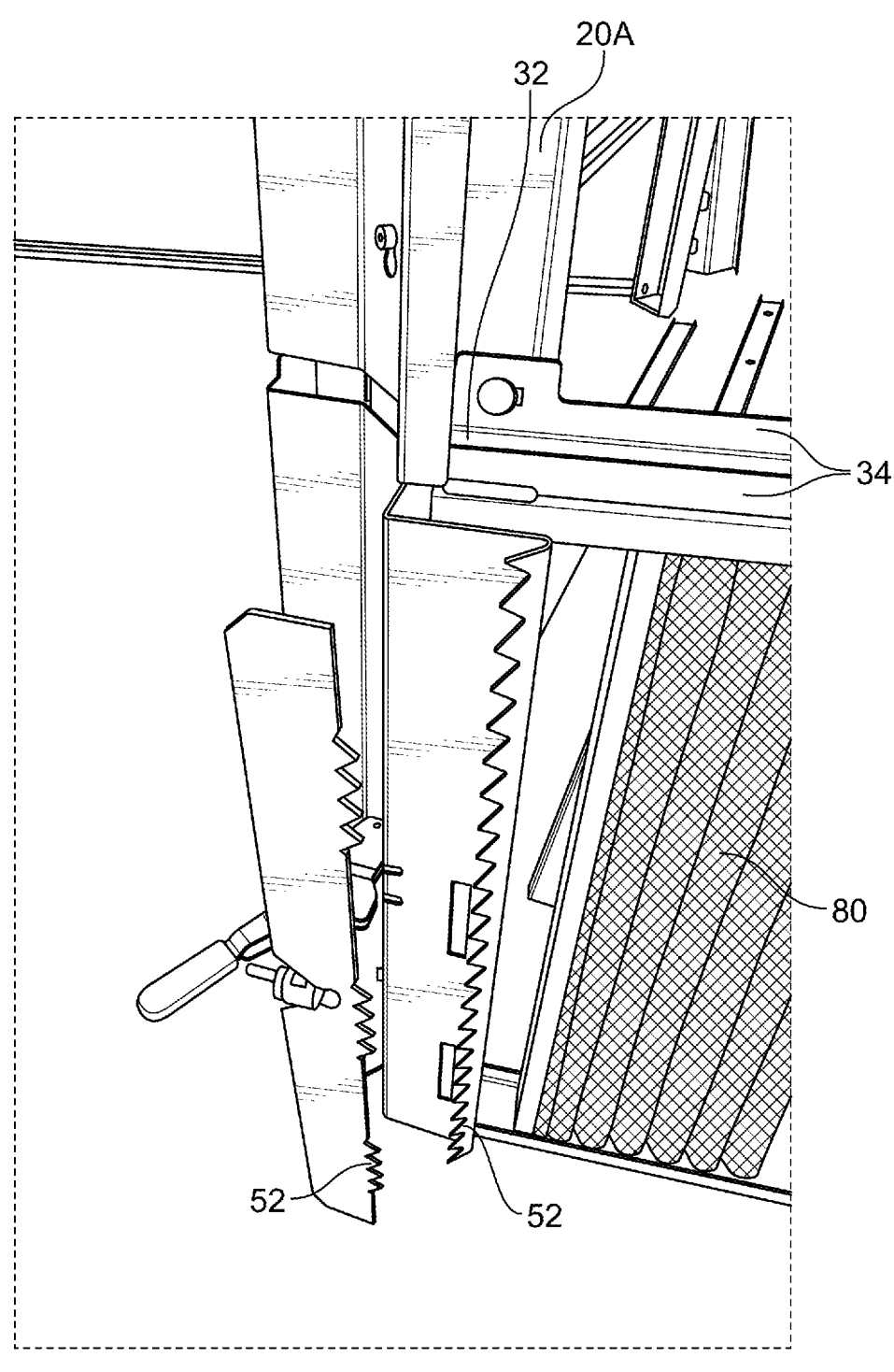
FIG. 11 is a side perspective view of a combination filter stop plate and prefilter clamp 50 embodiment that is removably attachable to a front row of frame uprights 20A, the prefilter clamp 50 with a clamp edge 52 that can be biased to clamp prefilter 82 fabric or material.
Figure 12:
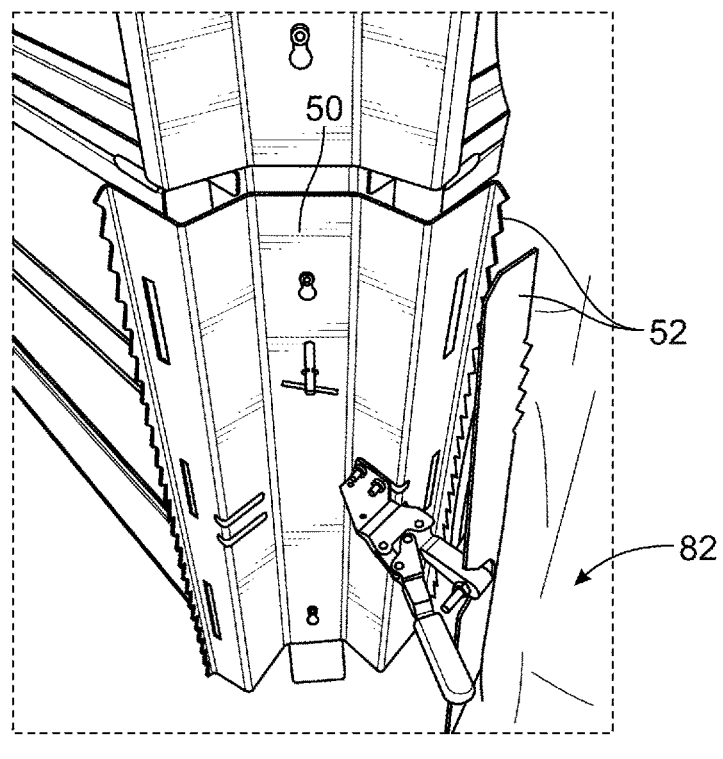
FIG. 12 is a rear perspective view of a combination filter stop plate and prefilter clamp 50 that is removably attachable to a front row of frame uprights 20A, the prefilter clamp 50 with a clamp edge 52 that can be biased with a clamp to grab prefilter 82 fabric or material.

FIGS. 4-6 illustrate a preferred filter stop plate 40 structure, and the preferred relative size and positioning of the stop plate 40. The filter stop plate 40 may comprise a filter stop-plate lateral surface 42 that is beveled to be substantially the same angle as the angle that the filter crossbars 30 extend from the frame crossbars 20, i.e., beveled at angle of between about 30 and 120 degrees, but preferably about ninety degrees, from the center surface of filter stop plate 40. As illustrated, the filter stop-plate lateral surface 42 extends and is positioned to secure filters 80 that have been received in the channels 34 that extend between the first and second distal ends 32 of vertically adjacent filter crossbars 30. FIGS. 7-9 are additional views of the preferred filter stop plate 40 and illustrate a keyhole on the filter stop plate 40 that facilitates removable attachment to a bolt extending from a frame upright 20. As illustrated in FIG. 8, the keyhole on the filter stop plate 40 may be aligned with the bolt on the frame upright 20 and removably attached thereto, as in FIG. 9.

FIGS. 10-14 illustrate the structure and use of a prefilter clamp 50. The clamp 50 preferably includes a clamp edge 52 that may be biased to clamp prefilter 82 material. Further, as is illustrated, the prefilter clamp 50 may comprise a combination filter stop plate and prefilter clamp 50 wherein the prefilter clamp edge 52 is positioned adjacent to the distal ends 32 of the crossbars 30 to secure filters 80 (as in FIG. 14) and may also be biased to secure prefilter 82 fabric or material between and to adjacent front row frame uprights 20A to prefilter particulate matter in the airflow that is subsequently filtered by the filters 80 installed in the filter frame 10. Moreover, as illustrated in FIG. 16, a prefilter 82 fabric or material may be clamped both across and between pairs of adjacent front row frame uprights 20A and at the top of the filter frame 10.

The system described enables method of filtering and airflow, comprising installing filters 80 in a filter frame 10 comprised of a plurality of frame uprights 20 and a plurality of filter crossbars 30, each of the filter crossbars 30 pivotally coupled at distal ends 32 thereof and substantially orthogonally to and between two of the frame uprights 20, wherein the frame uprights 20 are arranged in a front row of frame uprights 20A and a rear row of frame uprights 20B; and positioning the filter frame 10 in the path of an airflow. Further, if the floor upon which the filter frame 10 is positioned is uneven or slopes in any direction, the method may further comprise displacing at least one frame upright 20 vertically, relative to another frame upright 20 to accommodate the uneven or sloping floor.

In certain embodiments, the filter crossbars 30 comprise a channel 34 between the first and second distal ends 32 of the crossbars 30 and the step of installing comprises installing a filter 80 in each channel 34. Additionally, in certain embodiments, the method may include removably attaching a filter stop plate 40 to the front row of frame uprights 20A to secure a filter 80 between vertically adjacent filter crossbars 30 as illustrated in FIGS. 5-6 and 8-9.

Additionally, and as illustrated in FIGS. 10-15, the method may include installing a prefilter 82 between adjacent frame uprights 20 in the front row of frame uprights 20A wherein installing the prefilter includes opening first and second prefilter clamps 50 that may be removably attachable to one of frame uprights 20 in the front row of frame uprights 20A, and clamping prefilter 82 material in each prefilter clamps 50, the prefilter 82 material positioned between front row of frame uprights 20A and oriented orthogonally to the path of the airflow. Finally, as should be appreciated, the removable attachment of the filter stop plates 40 and prefilter clamps 50 to the front row of frame uprights 20A facilitates the maintenance of the filter frame 10 from the front row side of the filter frame 10. Accordingly, it may be possible to provide maintenance to filter frames 10 constructed according to the disclosure from only the "dirty air" side of the filter frame 10 and thereby facilitating maintenance of the filter frame 10 whilst also reducing the amount of particulate from the airflow that is directed onto the sensitive computer equipment being cooled.

Unless otherwise defined, all technical and scientific terms used herein have the same meaning as commonly understood by one of ordinary skill in the art to which this invention belongs. Although methods and materials similar to or equivalent to those described herein can be used in the practice or testing of the various embodiments of the present disclosure, suitable methods and materials are described above. All patent applications, patents, and printed publications cited herein are incorporated herein by reference in their entireties, except for any definitions, subject matter disclaimers or disavowals, and except to the extent that the incorporated material is inconsistent with the express disclosure herein, in which case the language in this disclosure controls. The various embodiments of the present disclosure may be embodied in other specific forms without departing from the spirit or essential attributes thereof, and it is therefore desired that the various embodiments in the present disclosure be considered in all respects as illustrative and not restrictive. Any headings utilized within the description are for convenience only and have no legal or limiting effect.

What is claimed is:

1. A filter frame, comprising:

a first frame upright;

a second frame upright;

a first filter crossbar including a first distal end, a second distal end and a first channel extending between the first distal end and the second distal end of the first filter crossbar, wherein the first channel is adapted to removably receive a lower portion of a first filter, wherein the first distal end of the first filter crossbar is pivotally connected substantially orthogonally to the first frame upright, and wherein the second distal end of the first filter crossbar is pivotally connected substantially orthogonally to the second frame upright; and a second filter crossbar positioned substantially parallel to the first filter crossbar, wherein the second filter crossbar includes a first distal end, a second distal end and a second channel extending between the first distal end and the second distal end of the second filter crossbar, wherein the second channel is adapted to removably receive an upper portion of the first filter opposite of the first channel of the first filter crossbar, wherein the first distal end of the second filter crossbar is pivotally connected substantially orthogonally to the first frame upright, and wherein the second distal end of the second filter crossbar is pivotally connected substantially orthogonally to the second frame upright.

2. The filter frame of claim 1, further comprising:

a third filter crossbar including a first distal end, a second distal end and a first channel extending between the first distal end and the second distal end of the third filter crossbar, wherein the first channel is adapted to removably receive a lower portion of a second filter, wherein the first distal end of the third filter crossbar is pivotally connected substantially orthogonally to the first frame upright, and wherein the second distal end of the third filter crossbar is pivotally connected substantially orthogonally to the second frame upright; and a fourth filter crossbar positioned substantially parallel to the third filter crossbar, wherein the fourth filter crossbar includes a first distal end, a second distal end and a second channel extending between the first distal end and the second distal end of the fourth filter crossbar, wherein the second channel is adapted to removably receive an upper portion of the second filter opposite of the first channel of the third filter crossbar, wherein the first distal end of the fourth filter crossbar is pivotally connected substantially orthogonally to the first frame upright, and wherein the second distal end of the fourth filter crossbar is pivotally connected substantially orthogonally to the second frame upright.

3. The filter frame of claim 1, wherein the first distal ends of the first filter crossbar and the second filter crossbar are coupled to the first frame upright at substantially the same distance apart as the second distal ends are coupled to the second frame upright.

4. The filter frame of claim 3, wherein the first distal ends of the third filter crossbar and the fourth filter crossbar are coupled to the second frame upright at substantially the same distance apart as the second distal ends are coupled to the third frame upright.

5. The filter frame of claim 1, further comprising a filter stop plate that is removably attachable to the first frame upright or the second frame upright to retain the first filter or the second filter.

6. The filter frame of claim 5, wherein the filter stop plate further comprises a prefilter clamp adapted to secure a prefilter.

7. The filter frame of claim 1, further comprising at least one prefilter clamp removably attachable to the first frame upright or the second frame upright adapted to secure a prefilter.

8. A filter frame, comprising:

a plurality of frame uprights; and a plurality of filter crossbars, each of the filter crossbars pivotally coupled at distal ends thereof and substantially orthogonally to and between two of the plurality of frame uprights, each filter crossbar with a channel; wherein the channels on vertically adjacent filter crossbars are distanced apart to slidably receive filters.

9. The filter frame of claim 8, wherein a subset of the plurality of frame uprights comprises a filter frame front boundary.

10. The filter frame of claim 9, wherein a fabric prefilter is removably attachable to and between two of the frame uprights of the filter frame front boundary.

* * * * *